(12) United States Patent
Kikunaga

(10) Patent No.: US 10,718,803 B2
(45) Date of Patent: Jul. 21, 2020

(54) STATIC ELECTRICITY DISTRIBUTION MEASURING DEVICE

(71) Applicant: NATIONAL INSTITUTE OF ADVANCED INDUSTRIAL SCIENCE AND TECHNOLOGY, Tokyo (JP)

(72) Inventor: Kazuya Kikunaga, Tosu (JP)

(73) Assignee: NATIONAL INSTITUTE OF ADVANCED INDUSTRIAL SCIENCE AND TECHNOLOGY, Tokyo (JP)

(*) Notice: Subject to any disclaimer, the term of this patent is extended or adjusted under 35 U.S.C. 154(b) by 5 days.

(21) Appl. No.: 16/092,540

(22) PCT Filed: Feb. 27, 2017

(86) PCT No.: PCT/JP2017/007452
§ 371 (c)(1),
(2) Date: Oct. 10, 2018

(87) PCT Pub. No.: WO2017/183304
PCT Pub. Date: Oct. 26, 2017

(65) Prior Publication Data
US 2019/0120887 A1    Apr. 25, 2019

(30) Foreign Application Priority Data
Apr. 21, 2016    (JP) ................... 2016-085485

(51) Int. Cl.
*G01R 29/12*    (2006.01)
*G01R 29/14*    (2006.01)
(Continued)

(52) U.S. Cl.
CPC ............ *G01R 29/14* (2013.01); *G01R 29/12* (2013.01); *G01R 29/24* (2013.01); *G01B 7/287* (2013.01); *G01B 21/16* (2013.01)

(58) Field of Classification Search
CPC ............ G01R 2129/12; G01R 2129/14; G01R 2129/16; G01R 2129/24;
(Continued)

(56) References Cited

U.S. PATENT DOCUMENTS 7,149,442 B2 * 12/2006 Ushijima ........... G03G 15/5037
                                                      399/48
8,169,210 B2 *  5/2012 Junginger ............. G01N 27/61
                                                      324/456
(Continued)

FOREIGN PATENT DOCUMENTS

JP          3169950    * 4/1991
JP        2008116328   * 5/2008

*Primary Examiner* — Thang X Le
(74) *Attorney, Agent, or Firm* — Kratz, Quintos & Hanson, LLP

(57) ABSTRACT

With prior art static electricity distribution measuring devices, there has been the problem that it has not been possible to measure the amount of electrostatic charge over a wide range at high spatial resolution and quickly.

In the present invention, there are provided: a detection unit 20 in which a plurality of sensors, provided upon a surface, move relatively along the surface of an electrostatically charged subject 100 to be measured, and detect potential changes generated by the distance to the surface of the measurement subject being changed; a reference distance measuring unit that measures the distance between the surface of the measurement subject and the surface of the detection unit; a distance adjustment unit that adjusts that distance so that it becomes a reference distance that is determined in advance; and a vibrating unit that causes the
(Continued)

distance between the surface of the measurement subject and the surface of the detection unit to change upon a predetermined cycle.

15 Claims, 5 Drawing Sheets

(51) Int. Cl.
*G01R 29/24* (2006.01)
*G01B 7/287* (2006.01)
*G01B 21/16* (2006.01)

(58) Field of Classification Search
CPC ........ G01R 2129/0814; G01R 27/2605; G01R 35/005; G01R 31/001; G01R 31/02; G01R 31/12; G01R 31/2887
See application file for complete search history.

(56) References Cited

U.S. PATENT DOCUMENTS

| | | | |
|---|---|---|---|
| 2004/0046123 A1* | 3/2004 | Dausch | B81B 3/0035 250/351 |
| 2007/0065169 A1* | 3/2007 | Kandori | G01R 15/165 399/73 |
| 2007/0108992 A1* | 5/2007 | Yanagisawa | G01R 19/20 324/658 |
| 2012/0174964 A1* | 7/2012 | Lin | G05D 3/12 136/246 |
| 2016/0154042 A1* | 6/2016 | Kikunaga | G01R 29/24 324/457 |
| 2016/0188053 A1* | 6/2016 | Wang | G06F 3/044 345/174 |

* cited by examiner

[Fig.1]
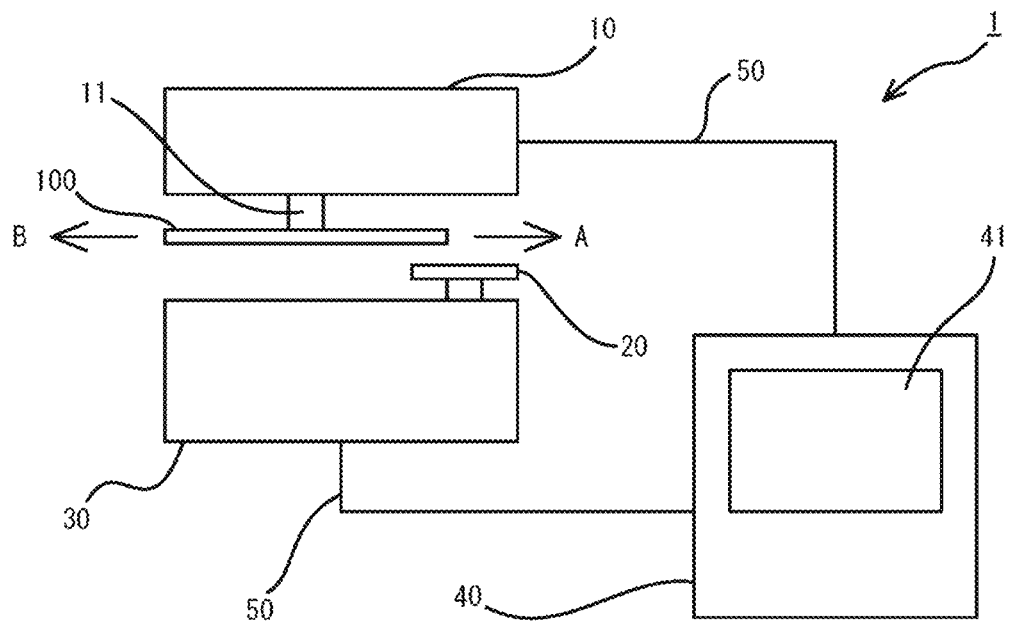
[Fig.2]
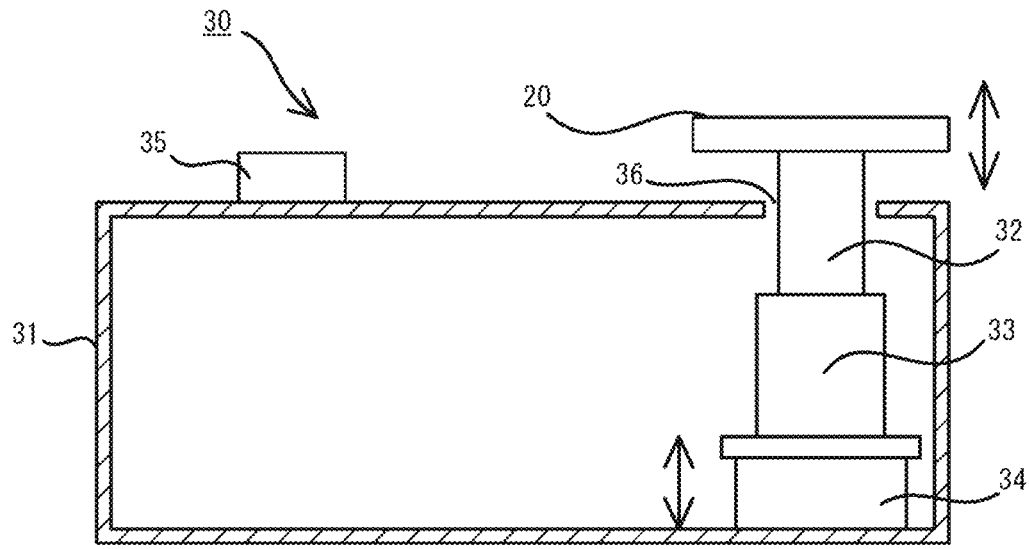

[Fig.3]
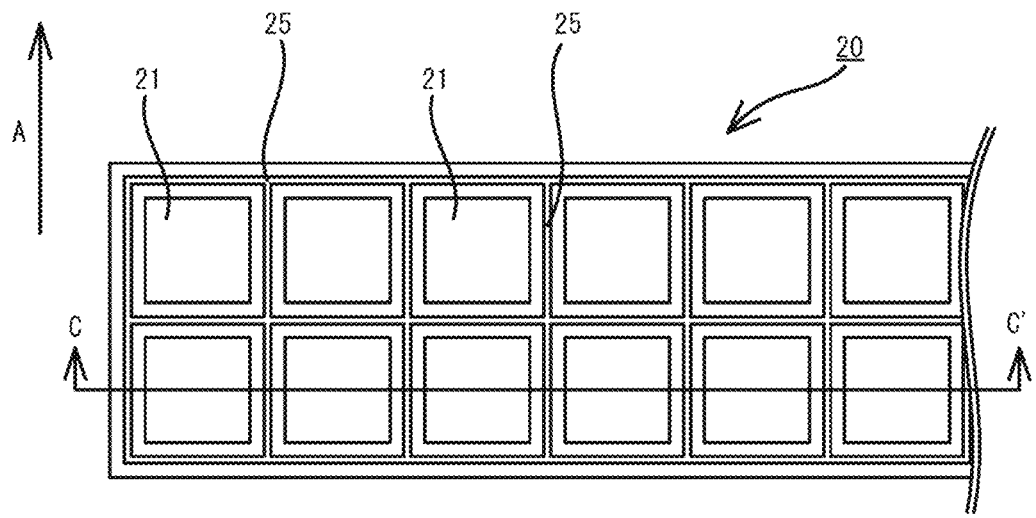
[Fig.4]
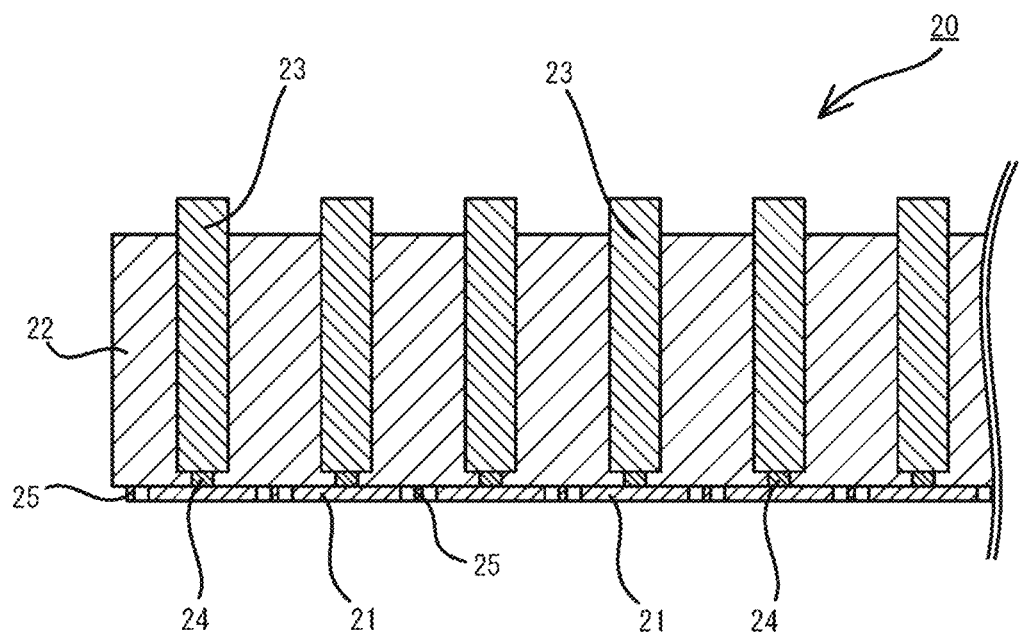

[Fig.5]
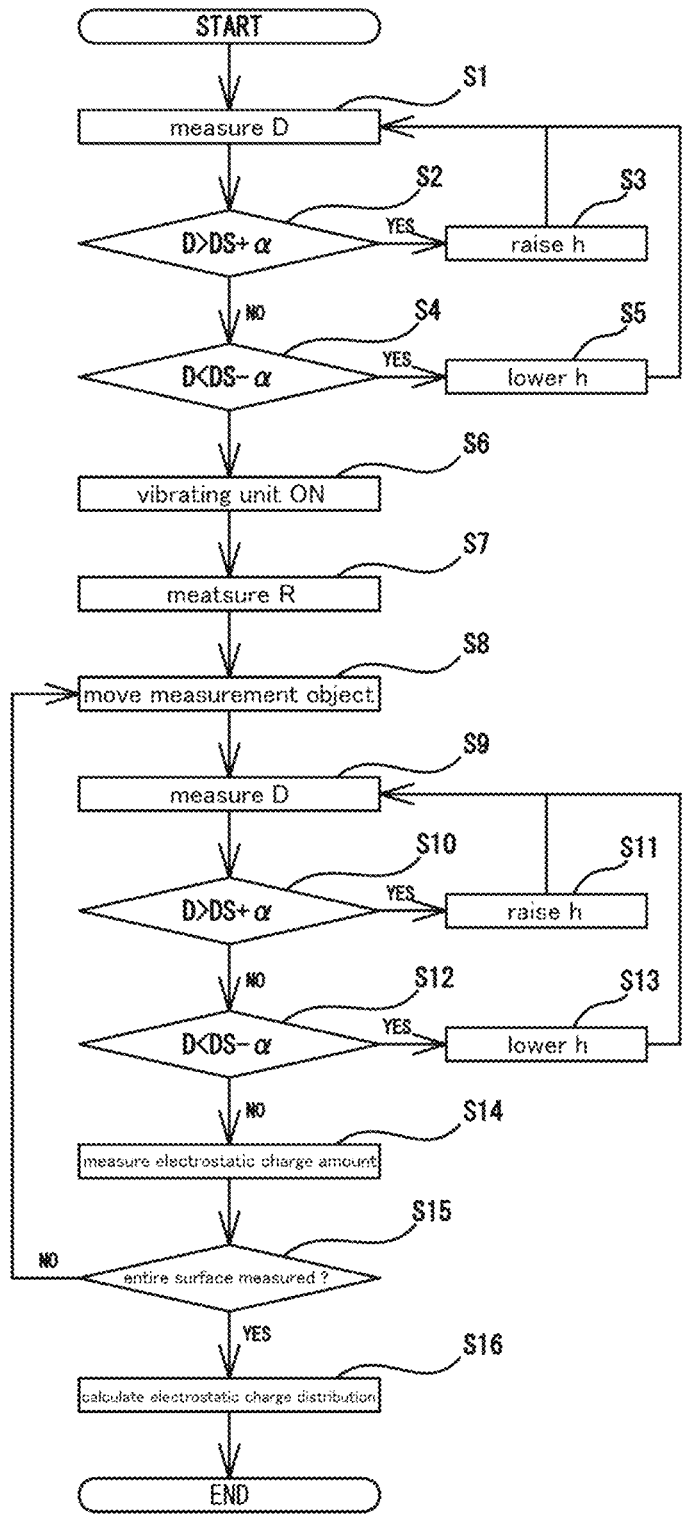

[Fig.6]
| variable | value |
|---|---|
| movement distance L | 1mm |
| number of movements N | 60 |
| vibration amplitude R | 0.5mm |
| reference distance DS | 1mm |
| distance D | 1.01mm |
| frequency | 100Hz |
| time constant | 300ms |
[Fig.7]
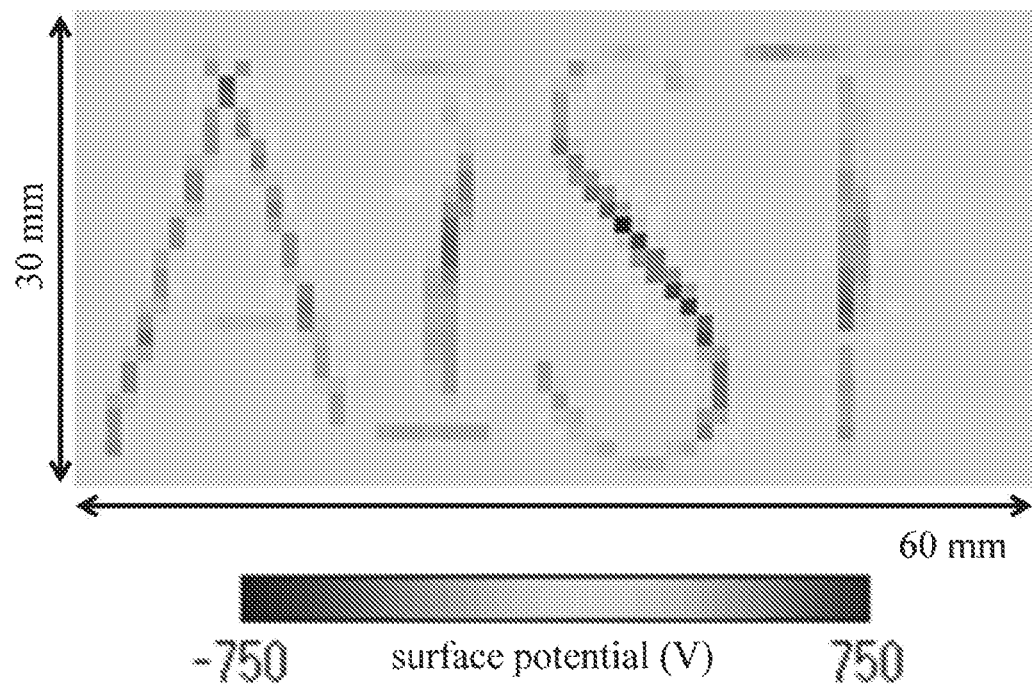

[Fig.8]
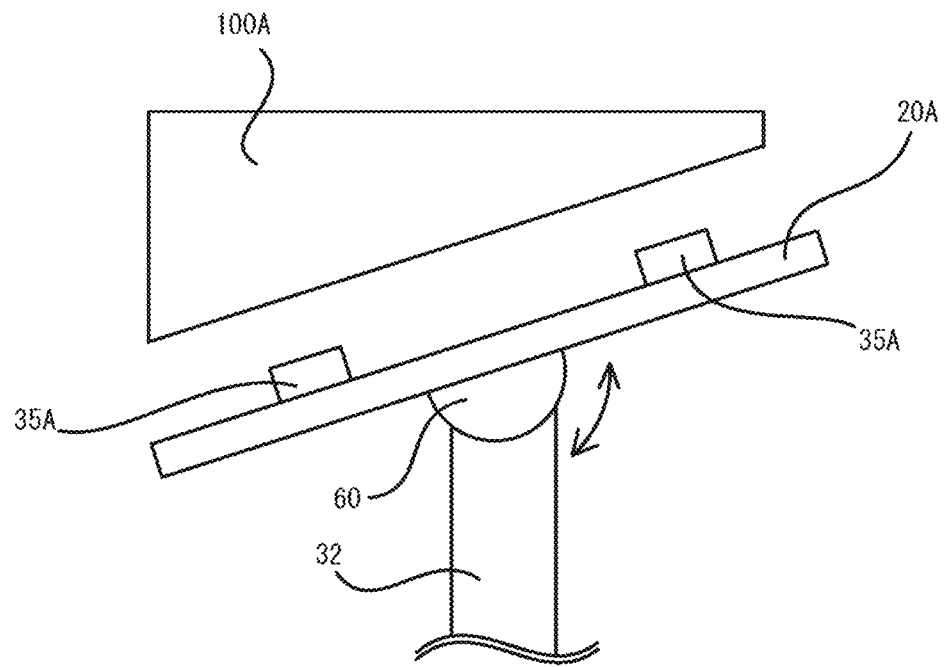
[Fig.9]
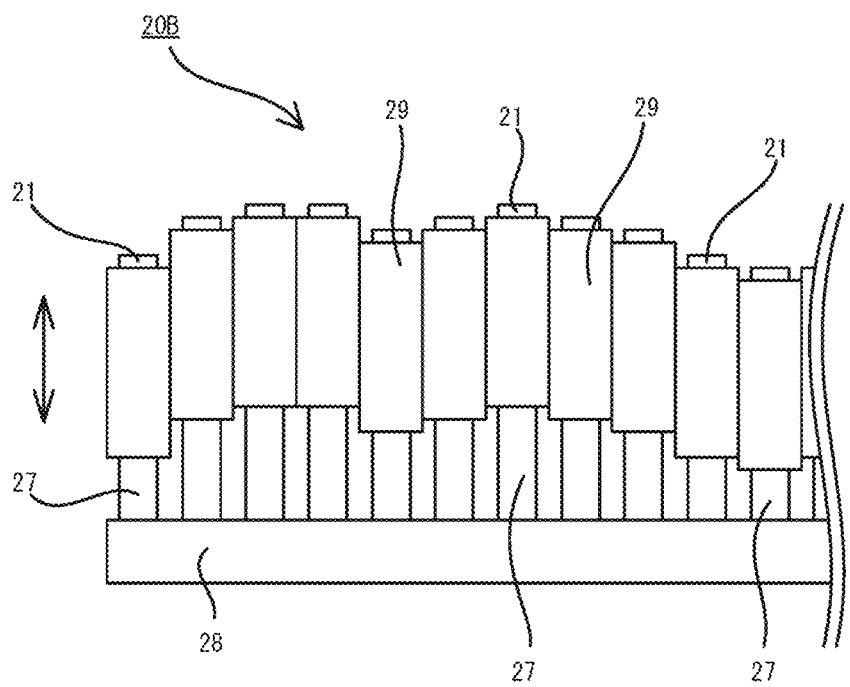

STATIC ELECTRICITY DISTRIBUTION MEASURING DEVICE

TECHNICAL FIELD

The present invention relates to a static electricity distribution measuring device that, in manufacturing sites of various types such as semiconductor manufacturing, electronic and electrical goods manufacturing, precision machinery manufacturing, transport equipment manufacturing, chemical manufacturing, fiber manufacturing, ceramics manufacturing, medical product manufacturing, foodstuff manufacturing and so on, measures the electrostatic charge amount distribution upon components that are used in manufacturing processes, or upon manufactured products that include metals or insulators.

BACKGROUND ART

In Japan, a large number of businesses are engaged in manufacturing industries of various types that support the foundations of industry, such as semiconductor manufacturing, electronic and electrical goods manufacturing, precision machinery manufacturing, transport equipment manufacturing, chemical manufacturing, fiber manufacturing, ceramics manufacturing, medical product manufacturing, foodstuff manufacturing and so on. In workplaces that are in charge of actual manufacture in this type of manufacturing industry, the manufactured products are assembled by automatic processing or by manual processing while many components flow along a production line.

Now, if there is a fault or a defect in one of the components that go into the manufactured product, or if there is a malfunction or a defect in the manufacturing process, then naturally a faulty or defective manufactured product will be the result, and there is the problem that the manufacturing yield decreases. Or, even if there is no problem with any component, sometimes faults or defects occur in the product after manufacture for various reasons. In relation both to the former and the latter cases, there are the problems that, in an automated manufacturing process, if an operational fault occurs in some step of the process, then the manufacturing speed (i.e. the manufacturing efficiency) drops, and/or the manufacturing yield of the final manufactured product is deteriorated.

In the prior art, centering upon large companies, there have been many cases in which a series of flows from research through development, design, manufacture, and quality control to sales have been performed in a vertically integrated manner. Businesses of this vertically integrated type are environments in which it is easy for responses in development and design in relation to quality shortcomings and reductions of yield rate of manufactured goods (both finished products and part-finished products) that occur in a manufacturing site to be fed back and/or fed forward within the same company.

On the other hand, in recent years, manufacturers (i.e. manufacturing plants) are being converted into subsidiary companies due to problems of manufacturing costs when they are together in the same business, and also manufacturing companies that only perform contract manufacturing are appearing. In a similar manner, "fabless" businesses and so on that only perform research and development but do not perform manufacture also are flourishing in the fields of electronics, information and communication, and so on.

In this manner, in current manufacturing industry, there is an increasing physical, temporal, technical, and human dissociation between the area of development and design and the area of actual manufacturing. When there is such a dissociation, feed back and feed forward between a manufacturing site and a development site become difficult in relation to poor product quality and deterioration of yield rate occurring in the manufacturing site. Because of this difficulty, there is a concern that manufacturing capacity in Japanese manufacturing industry (including contract manufacturers that only perform manufacture to contract, manufacturing subsidiaries, fabless businesses and so on) is declining.

There can be various causes of deterioration in product quality and yield rate at a manufacturing site. Some causes are inevitable, such as poor ease of design and manufacture, level of experience of the manufacturing site, manufacturing process flow, manufacturing equipment, human skills, and so on, but a cause that is often overlooked is static electricity. In other words, there are causes of various kinds that can lead to faults or defects in components, manufactured products or manufacturing processes of this type, but static electricity is also considered as being one possible cause.

In a manufacturing facility, in consideration of adverse effects of this type upon components, manufactured products, manufacturing processes and so on due to static electricity, means have been devised for prevention of static upon factory buildings, floors, walls and so on and for preventing buildup of static electricity upon the clothing of workers, and means have been implemented in order for static electricity not to exert any influence upon components, manufactured products, manufacturing processes and so on. In concrete terms, static electricity has been eliminated from floor surfaces, walls, conveyor lines and so on before working starts, grounds have been provided for discharging static electricity, and contrivances have been implemented in order for static electricity not to build up upon parts used in the manufacturing process or upon the manufactured products.

Furthermore, in manufacturing plants, means have also been devised for eliminating static electricity in advance from components to be used in the manufacturing process. And, in a similar manner, operators are also performing measures for only starting work after elimination of static electricity.

In this manner, in manufacturing plants, contrivances of various types have been implemented for suppressing the negative influence of static electricity. Despite this ingenuity, the problem of buildup of static electricity upon parts used in manufacturing processes and upon the manufactured products is not yet perfectly solved. For example, there is steady progress in reduction of power consumption in electronic equipment and precision equipment and so on made in manufacturing plants. Along with the reduction of power consumption, the capability of components that are used in the manufacture of such electronic equipment and precision equipment for resisting static electricity is undesirably decreasing. Due to this, the components used in the manufacture of such electronic equipment and precision equipment often become charged with static electricity and can easily become faulty.

There are various kinds of components that are used in the manufacture of such electronic equipment and precision equipment. For example, parts made from resin or vinyl (such as connectors, covers for screens, casings and so on) are also used in many ways. These components have a certain size, and, if they become charged with static electricity, this may sometimes engender unpredictable behavior.

For example, a plurality of components may flow in a conveyor line and may enter a process in which they are arranged in fixed positions, or may enter into a process of visual testing by image processing. In a process of this type, it is desirable for the plurality of parts that have been put onto the conveyor line to flow in the conveyor line while appropriate feeding intervals between them are maintained.

However, if such parts are electrostatically charged, then behavior on the conveyor line such as parts getting closer to one another due to static electricity or repelling one another and moving further apart or the like may occur. In some circumstances, adjacent parts may actually stick together. When this type of behavior takes place, appropriate processing for implementing the arrangement process or the external visual testing process described above may undesirably become impossible, and sometimes it may happen that a product is automatically determined as being defective, even though actually it is good.

If such unpredictable behavior of components undesirably takes place in the arrangement process or the external visual inspection process, then it is necessary to stop the conveyor line temporarily. It can be predicted that this type of behavior may be caused by electrostatic charge, but, as a countermeasure, there is no choice but to eliminate static electricity from the conveyor line, from all the processing equipment, and from all parts fed onto the conveyor line. If the conveyor line is stopped due to this type of static electricity elimination task, a large loss will eventuate to the manufacturing plant. Manufacturing operation stops during the task of static electricity elimination (which, depending upon the circumstances, may occupy half a day or a full day).

It is known that static electricity is the cause for components to exhibit behavior of the type described above, but the actual mechanism that leads to such behavior has not really been elucidated. In particular, sometimes components may exhibit different behaviors such as approaching toward one another or moving apart or the like, and sometimes they may exhibit no unusual behavior at all. Due to this fact, it is difficult to clarify the mechanisms that lead to such behavior, because it is not known how the static electricity (surmised to be) charged upon the components is distributed upon the components. If it is difficult to elucidate the mechanism, then it is also of course impossible to investigate countermeasures for preventing behavior of the sort described above.

Additionally, covers made from resin or vinyl or the like that are attached to the screens of portable telephones and smart phones and so on are liable to become charged with static electricity due to their material and their area. If such a component is employed in the process of assembly of an electronic device or a precision device, then, if the component is still charged with static electricity, then sometimes it may happen that, due to its electrostatic charge, the position in which it is installed may deviate in an arbitrary manner, which is undesirable. A device during the assembly of which this type of deviation has happened naturally turns out to be defective.

In this case as well, it can be surmised that accumulation of electrostatic charge upon the component is the cause, but the relationship between the behavior and the electrostatic charge is unknown. It is impossible to anticipate resolution of the problem if this relationship is not known. In other words, clear understanding of how a component or the like becomes charged with static electricity is a prerequisite for solution of such problems that arise in a manufacturing process. To put this in another manner, for it to be possible to check the nature of the distribution in which static electricity is charged upon a component or the like is a precondition for clarifying the behavior of the component.

Furthermore, in devices such as printers that take advantage of static electricity, it is necessary to verify the static electricity distribution of parts that utilize electrostatic charging.

In this manner, as a precondition for solution of problems of various types in manufacturing processes and so on that are considered to be caused by static electricity, and as a precondition for checking the performance and characteristics of components that utilize static electricity, it is desirable to be able to measure the electrostatic charge amount distribution upon a component or the like accurately and also quickly.

As devices for measuring amounts of electrostatic charge of this type, there have been proposed a surface electrometer or an electrostatic force microscope, or a electrostatic charge amount measuring device etc. that calculates an amount of electrostatic charge by measuring, as a change in potential, a virtual electromagnetic wave generated by vibration imparted to the measurement subject (for example, refer to Patent Documents #1 and #2).

CITATION LIST

Patent Literature

Patent Document #1: Japanese Patent Specification 5,665,151.
Patent Document #2: International Publication WO 2015/011942.

SUMMARY OF INVENTION

Technical Problem

However, with a surface electrometer (of the electrostatic induction type or the vibration displacement type), there has been the problem that it is only possible to measure an amount of electrostatic charge that is limited within a narrow area (i.e. it is not possible to measure the amount of static electricity with a resolution of 1 mm or less). Moreover with a surface electrometer it is not possible to make the sensor more compact, because chopping and a vibration mechanism are essential, so that it is not possible to deploy a number of compact sensors in an array. As a result, there has been the problem that it has been impossible to measure an electrostatic charge amount distribution at high spatial resolution (around 1 mm) with a single measurement operation. Accordingly, in order to measure an amount of electrostatic charge at a spatial resolution of around 1 mm and moreover over a wide range (of several square centimeters) by using a surface electrometer, it has been necessary to scan that range point by point with the surface electrometer, and there has been the problem that measurement of an electrostatic charge amount distribution in this way takes a long period of time.

Furthermore, with an electrostatic microscope, although it is possible to perform measurement with a very high spatial resolution (of the order of one μm), there has been the problem that the range over which measurement can be performed is small (of the order of 2 mm2). Moreover there is the problem that, since, with an electrostatic microscope, it is necessary to control the cantilever (which is a structural element) at high accuracy, accordingly it is not possible to arrange the sensors in an array as in a surface electrometer, and thus it is not possible to measure an electrostatic charge amount distribution by performing a single episode of measurement. Thus there has been the problem that, since in order to measure an electrostatic charge amount distribution using an electrostatic microscope it is necessary to scan the range of the electrostatic microscope point by point, accordingly it takes a long period of time to measure the electrostatic charge amount distribution.

On the other hand, with the electrostatic charge amount measuring devices disclosed in Patent Documents #1 and #2, it is possible to measure the amount of electrostatic charge at high accuracy, but since it is necessary to vibrate the object to be measured locally in order to measure the amount of electrostatic charge with a high spatial resolution of the order of 1 mm, accordingly it is necessary locally to vibrate the entire range to be measured. As a result, there is the problem that it takes a considerable period of time to measure an electrostatic charge amount distribution.

In view of the considerations described above, the object of the present invention is to provide a static electricity distribution measuring device, that is capable of rapidly measuring an electrostatic charge amount distribution upon an object to be measured at high spatial resolution over a wide range.

Solution to Technical Problem

As a result of continued diligent research in relation to the problems described above, the inventors of the present invention have developed an epochal static electricity distribution measuring device having a construction as will now be described.

A first aspect of the present invention that solves the problems described above is a static electricity distribution measuring device, characterized by comprising: a detection unit that moves relatively along the surface of an electrostatically charged subject to be measured, and that is provided upon a surface thereof with a plurality of sensors that detect potential changes generated by the distance to the surface of the measurement subject being changed; a reference distance measuring unit that measures the distance between the surface of the measurement subject and the surface of the detection unit; a distance adjustment unit that adjusts the distance between the surface of the measurement subject and the surface of the detection unit, so that the distance measured by the reference distance measuring unit becomes a reference distance that is determined in advance; a vibrating unit that causes the distance between the surface of the measurement subject and the surface of the detection unit to change upon a predetermined cycle; a measuring unit that measures at least one of the amounts of change, the frequencies, and the phase angles of the potentials detected by the detection unit; and a calculation unit that calculates the amount of electrostatic charge upon the surface of the measurement subject, on the basis of the relative movement distance of the measurement subject with respect to the detection unit, and the result of measurement by the measuring unit.

Here, "that moves relatively" means that the measurement subject is fixed and the detection unit is moved, or that the detection unit is fixed and the measurement subject is moved, or that both of these are combined. Moreover, "amounts of change of potential" means the differences between the maximum potentials and the minimum potentials (i.e. the differences in potentials) detected by the sensors as the relative distances between the electrostatically charged portions of the measurement subject and the detection unit change cyclically. And "frequencies of the potentials" means the frequencies of the potentials detected by the sensors as the relative distances between the electrostatically charged portions of the measurement subject and the detection unit change cyclically. Furthermore, "phase angles of the potentials" means the differences in phase between the cycles of the relative distances between the electrostatically charged portions of the measurement subject and the detection unit and the frequencies of the potentials detected by the sensors as the relative distances between the electrostatically charged portions of the measurement subject and the detection unit change cyclically.

With this first aspect of the present invention, since it is possible to detect the amounts of static electricity upon the narrow regions of the measurement subject that the sensors oppose while continuously scanning the surface of the measurement subject that moves relatively without stopping operation, accordingly it is possible to measure the amounts of electrostatic charge upon the measurement subject at high spatial resolution over a wide range and moreover quickly. In other words since, while relatively moving the measurement subject, it is possible to detect the amounts of electrostatic charge upon its surface with the sensors that are positioned to oppose them at that instant, accordingly it is possible to measure the amounts of electrostatic charge upon the measurement subject at high spatial resolution over a wide range and moreover quickly. Here, "amounts of electrostatic charge" means the surface potentials, the amounts of electric charge, and their electrical polarities.

A second aspect of the present invention is a static electricity distribution measuring device according to the first aspect described above, characterized in that the plurality of sensors are arranged in a column in a direction that intersects the direction of movement of the measurement subject.

Since, with this second aspect of the present invention, it is possible to measure the changes of potential in a predetermined range upon the surface of the measurement subject all at once with the plurality of sensors that are arranged in a column, accordingly it is possible to measure the electrostatic charge amount distribution over a wider range upon the surface of the measurement subject, and more quickly.

A third aspect of the present invention is a static electricity distribution measuring device according to the first or the second aspect described above, characterized in that a pivoting unit is provided that is capable of pivoting at least either one of the measurement subject and the detection unit, so that the detection unit becomes parallel to the surface of the measurement subject.

Since, with this third aspect of the present invention, it is possible to pivot at least either one of the measurement subject and the detection unit to match the shape (i.e. the thickness) of the measurement subject so that the distances between the measurement subject and the sensors become equal, accordingly, even in the case of a measurement subject whose shape changes, still it is possible to measure the amount of electrostatic charge upon its surface at high accuracy and moreover quickly.

A fourth aspect of the present invention is a static electricity distribution measuring device according to any one of the first through the third aspects described above, characterized in that each of the sensors is capable of movement in the direction of the measurement subject.

With this fourth aspect of the present invention, it is possible to perform adjustment so that, by moving the sensors to match the shape of the measurement subject, for each sensor, the distance to the surface of the measurement subject becomes equal to the reference distance. As a result, this static electricity distribution measuring device according to the fourth aspect of the present invention is capable of measuring the electrostatic charge amount distribution upon the surface of the measurement subject at high accuracy and also quickly, even if the shape of the measurement subject is complicated.

A fifth aspect of the present invention is a static electricity distribution measuring device according to any one of the first through the fourth aspects described above, characterized in that absorption portions that absorb electromagnetic influence are provided upon at least portions of the peripheries of the sensors.

Here, "electromagnetic influence" means anything that can exert influence upon the potential changes detected by the sensors, such as electric fields, magnetic fields, noise or the like.

Since, with this fifth aspect of the present invention, electromagnetic influences that are emitted from portions other than the portions that oppose the sensors are absorbed by the absorption portions that are positioned upon the peripheries of the sensors, accordingly it is possible for the sensors principally to detect potential changes from the portions that oppose them. As a result, it is possible to measure the electrostatic charge amount distribution upon the measurement subject at positions that are more accurate and moreover in narrower areas (i.e. at higher spatial resolution).

A sixth aspect of the present invention is a static electricity distribution measuring device according to any one of the first through the fifth aspects described above, characterized in that the measurement subject and the detection unit are held within an atmosphere of 100 atm or lower.

Since, with this sixth aspect of the present invention, it is possible to reduce the amounts of gas (oxygen and so on) and of moisture that can easily cause gas discharge, accordingly it is possible to perform measurement of the amounts of electrostatic charge upon the surface of the measurement subject at higher accuracy.

BRIEF DESCRIPTION OF DRAWINGS

FIG. 1 is a schematic illustration of a static electricity distribution measuring device according to a first embodiment;

FIG. 2 is a schematic cross sectional view showing an electrostatic charge amount measuring unit according to the first embodiment;

FIG. 3 is a schematic plan view of a detection unit according to the first embodiment;

FIG. 4 is a schematic sectional view of this detection unit according to the first embodiment;

FIG. 5 is a flow chart showing the operation of this static electricity distribution measuring device according to the first embodiment;

FIG. 6 is a table showing the measurement conditions of a concrete example;

FIG. 7 is a graph showing the results of this concrete example;

FIG. 8 is a schematic figure showing a detection unit according to a second embodiment; and FIG. 9 is a schematic figure showing a detection unit according to a third embodiment.

DESCRIPTION OF EMBODIMENTS

Embodiments of the static electricity distribution measuring device according to the present invention will now be explained with reference to the appended drawings. It should be understood that the present invention is not to be considered as being limited by the embodiments described below.

Embodiment #1

FIG. 1 is a schematic figure showing a static electricity distribution measuring device according to this embodiment. As shown in FIG. 1, this static electricity distribution measuring device 1 comprises: a measurement subject moving unit 10; a detection unit 20 that is arranged so as to oppose the measurement subject moving unit 10 with a rectangular measurement subject 100 between them; an electrostatic charge amount measuring unit 30 to which the detection unit 20 is attached; and a result display unit 40, which is a calculation unit that is connected via wiring 50 both to the measurement subject moving unit 10 and also to the electrostatic charge amount measuring unit 30.

The measurement subject moving unit 10 is fixed to a fixed body (not shown in the figures), and is adapted to be capable of holding the measurement subject 100 via a measurement subject holding unit 11. Moreover, the measurement subject moving unit 10 internally houses a motor (not shown in the figures) that is adapted to be capable of causing the measurement subject holding unit 11 to move either in a direction A or in a direction B, and that is accordingly adapted to be capable of causing the measurement subject 100 to move, via the measurement subject holding unit 11, either in the direction A or in the direction B. Moreover, the measurement subject moving unit 10 comprises a movement distance detection unit (not shown in the figures), and is thereby adapted to be capable of detecting the distance through which the measurement subject 100 has been moved in the direction A or in the direction B, and the number of times it has been moved. The measurement subject moving unit 10 is not to be considered as being particularly limited, provided that it has this type of function. The direction A or the direction B in FIG. 1 could also be the direction away from the viewer or the direction toward the viewer.

The result display unit 40, which is also a calculation unit, comprises a display unit 41 such as a display or the like, and is adapted to be capable of displaying the electrostatic charge amount distribution upon the surface of the measurement subject 100 that faces toward the detection unit 20, as will be described hereinafter. The result display unit 40 is not to be considered as being particularly limited, provided that it is capable of calculating the amount of change, the frequency, and the phase angle of change of potential detected by the detection unit 20 and of calculating an electrostatic charge amount on the basis of at least one of these, and moreover of displaying the distribution of static electricity upon the surface of the measurement subject; for example, it may be a personal computer or the like. It should be understood that, for the method of calculating the potential change, for the method of calculating the electrostatic charge amount from the amount of change, the frequency, and the phase angle of the potential change, and for the method of displaying the static electricity distribution, the methods described in Patent Documents #1 and #2, or the like, may be employed.

For example, the charge amount (i.e. the amount of electrostatic charge) Q upon the portion of the measurement subject 100 that opposes a sensor 21 that will be described hereinafter may be calculated according to the following Equation:

$$Q = \frac{\Delta V \varepsilon S}{D \pm R} \quad \text{Equation 1}$$

Here, ΔV is the difference between the maximum potential and the minimum potential detected by the sensor 21 (i.e. the potential difference), ε is the relative permittivity between the sensor 21 and the portion of the measurement subject 100 that opposes this sensor 21, S is the area of the sensor 21, D is the distance between the upper surface of the detection unit 20 and the lower surface of the measurement subject 100, and R is the amplitude of the vibration.

By calculating the electrostatic charge amount upon the various portions of the measurement subject 100 that oppose the sensors 21 while the measurement subject 100 is moved by using this equation, it is finally possible to measure the static electricity distribution upon the surface of the measurement subject 100.

It should be understood that, if the electric charge amount Q, the permittivity ε, the area S of the sensor 21, and the distance D remain constant, then the potential difference ΔV that is detected can be calculated according to the following Equation:

$$\Delta V = a \pm bR \quad \text{Equation 2}$$

Here, a and b are predetermined constants.

According to this equation, the potential difference ΔV detected by the sensor is given by a function of the amplitude R only. And it will be understood that, along with the amplitude R becoming larger, the potential difference ΔV also becomes larger. Accordingly, with this static electricity distribution measuring device 1, if the electrostatic charge amount is small, then it is possible to detect this electrostatic charge amount at high accuracy by adjusting the amplitude R (to be large).

Furthermore, in relation to whether the electric charge on the various portions of the measurement subject 100 is positive or negative, this can be determined by considering the direction of the current that flows in the sensor 21 when the measurement subject 100 is caused to vibrate. For example, when a portion of the measurement subject 100 that is electrified with a positive electrical charge is moved upward, the direction of this electrical current is the same direction as the direction in which the measurement subject 100 is moved, while, when a portion of the measurement subject 100 that is electrified with a negative electrical charge is moved upward, the direction of this electrical current is the opposite direction to the direction in which the measurement subject 100 is moved. Due to this, when positive and negative electric charges are detected, the phase angle of the potential detected by the sensor 21 differs by 180°. Accordingly, by determining this phase angle, it is possible to distinguish whether the electric charge upon the portion of the measurement subject 100 that opposes the sensors 21 is positive or negative.

The wiring 50 is not particularly limited, provided that it is capable of transmitting signals between the various structural elements.

Next, the electrostatic charge amount measuring unit 30 will be explained with reference to FIG. 2. FIG. 2 is a schematic cross sectional figure showing the electrostatic charge amount measuring unit 30. As shown in FIG. 2, the electrostatic charge amount measuring unit 30 comprises a shaft 32 that is disposed in the interior of a box shaped casing 31 on the right side, a vibrating unit 33 disposed below the shaft 32, a distance adjustment unit 34 disposed below the vibrating unit 33, and a reference distance measuring unit 35 that is disposed in the upper left side portion of the casing 31. However, this arrangement of the elements is not to be considered as being particularly limitative, provided that each of them is capable of manifesting its respective function.

The reference distance measuring unit 35 is not to be considered as being particularly limited, provided that it is capable of measuring the distance D between the lower surface of the measurement subject 100 and the upper surface of the detection unit 20, and the amplitude R of the vibrating unit 33; for example, it would be acceptable for it to be a laser displacement sensor or the like.

The distance adjustment unit 34 is adapted to be capable of performing adjustment so that, by adjusting the position of the vibrating unit 33 on the basis of the distance measured by the reference distance measuring unit 35, the distance between the lower surface of the measurement subject 100 and the upper surface of the detection unit 20 is brought to a reference distance DS that is determined in advance. The distance adjustment unit 34 is not to be considered as being particularly limited, provided that it is capable of accurately adjusting the position (i.e. the height h) of the vibrating unit 33.

The vibrating unit 33 is adapted to be capable of causing the detection unit 20 to vibrate in the vertical direction by causing the shaft 32 to vibrate in the vertical direction. The vibrating unit 33 is not to be considered as being particularly limited, provided that it is capable of causing the detection unit 20 to vibrate together with the shaft 32 on a predetermined cycle. Moreover, the period of vibration (i.e. the number of vibrations per second) of the vibrating unit 33 is not to be considered as being particularly limited, but is desirably within the range of 10 Hz to 5 kHz, and in particular is more desirably within the range of 100 Hz to 1 kHz. Furthermore, the amplitude R of the vibrating unit 33 is also not to be considered as being particularly limited, but is desirably within the range of 0.01 mm to 1 mm, and in particular is more desirably within the range of 0.05 mm to 0.5 mm.

The shaft 32 is connected to the detection unit 20 through a hole 36 that is provided in the upper right portion of the casing 31. The shaft 32 is also not to be considered as being particularly limited, provided that it is capable of holding the detection unit 20. Moreover the mutual positional relationship of the upper portion of the casing 31, the hole 36, and the detection unit 20 is not to be considered as being particularly limited.

Furthermore, the electrostatic charge amount measuring unit 30 also comprises a lock in amplifier (not shown in the figures), such as for example a Model 7210 measuring unit manufactured by Signal Recovery Co. or the like, that is adapted to be capable of eliminating noise and so on from the signals detected by the detection unit 20 and of measuring minute signals on multiple channels simultaneously. The time constant of this lock in amplifier is not to be considered as being particularly limited, but is desirably within the range of 0.1 ms to 1 s, and is more desirably within the range of 1 ms to 300 ms.

Next, the detection unit 20 will be explained with reference to FIGS. 3 and 4. FIG. 3 is a schematic view showing the top surface of the detection unit 20, and FIG. 4 is a schematic sectional view of the detection unit 20 as seen in the direction C C' shown in FIG. 3. As shown in FIGS. 3 and 4, a plurality of sensors 21 are provided upon the top surface of the detection unit 20, and are arrayed in two columns in the direction orthogonal to the direction of movement A of the measurement subject 100. The sensors 21 are formed as squares, and are arranged at predetermined intervals. Here, although the size of the sensors 21 is not to be considered as being particularly limited, it is desirable for them to be of sizes within the range of 0.1 mm×0.1 mm~5 mm×5 mm, and in particular it is more desirable for them to be of sizes within the range of 0.1 mm×0.1 mm~1 mm×1 mm.

Since, by structuring the detection unit 20 in this manner, it is possible to detect all of the changes of potential of the measurement subject 100 in the width direction by measuring them all at the same time, accordingly, as a result, it is possible to measure the electrostatic charge amount distribution of the measurement subject 100 quickly.

Each of the sensors 21 is connected via a connection portion 24 to an electrically conductive member 23 that is inserted into a detection unit main body 22 that is made from an insulating material such as resin or the like, and that is adapted to be capable of transmitting a signal related to the potential change detected by that sensor 21 to the electrostatic charge amount measuring unit 30 via a cable (not shown in the figures) that is connected to the electrically conductive member 23. It should be understood that it would be acceptable for the connection portions 24 not to be provided, provided that the sensors 21 and the electrically conductive members 23 are electrically connected together.

Furthermore, absorption portions 25 that surround the periphery of each of the sensors 21 are provided integrally around the peripheries of the sensors 21, and each of these portions 25 is adapted to be capable of absorbing the electromagnetic influence from portions upon the surface of the measurement subject 100 other than the portion that directly opposes the corresponding sensor 21. Thus, since the sensors 21 are able principally to detect changes of potential from the opposing portions of the measurement subject 100, accordingly it is possible to measure electrostatic charge amounts at more accurately determined positions. As a result, this static electricity distribution measuring device 1 is able to measure a static electricity distribution at a higher spatial resolution.

Provided that they are able to detect changes of potential, the sensors 21 are not to be considered as being particularly limited; for example, they could be thin metallic layers. Furthermore, provided that they are able to absorb electromagnetic influences, the absorption portions 25 also are not to be considered as being particularly limited; for example, they could be thin metallic layers or could be made from an electromagnetically absorbent sheet material. Yet further, the electrically conductive members 23 and the connection portions 24 also are not to be considered as being particularly limited to being capable of transmitting signals via cables; copper wire or the like may be suggested for the electrically conductive members 23, and solder or the like may be suggested for the connection portions 24.

Next, the operation of this static electricity distribution measuring device 1 will be explained. FIG. 5 is a flow chart showing the operation of the static electricity distribution measuring device 1.

As shown in FIG. 5, when the static electricity distribution measuring device 1 is started, first, the distance D between the lower surface of the measurement subject 100 and the upper surface of the detection unit 20 is measured by the reference distance measuring unit 35 (step S1). And then the magnitudes of the distance D and a reference distance DS+α are compared together (step S2). And, if the distance D is greater than the reference distance DS+α, then the position of the vibrating unit 33 (i.e. its height h) is raised by just a predetermined height (step S3), and the distance D is measured again. Here, α is a tolerance value for the reference distance DS that is determined in advance, and, while its magnitude is not to be considered as being particularly limited, it is desirably in the range of 0.01 mm to 5 mm, and in particular is more desirably in the range of 0.05 mm to 1 mm.

On the other hand, if the distance D is less than or equal to the reference distance DS+α, then the magnitudes of the distance D and another reference distance DS α are compared together (step S4). And, if the distance D is less than the reference distance DS α, then the position of the vibrating unit 33 (i.e. its height h) is lowered by just a predetermined height (step S5). And operation such as described above is repeated until the distance D is greater than DS α and is less than DS+α.

Next, the drive for the vibrating unit 33 is turned ON (step S6), and, along with the amplitude R of the vibrating unit 33 being measured by the reference distance measuring unit 35, this amplitude R is transmitted to the result display unit 40 (step S7). Subsequently, along with the measurement subject 100 being moved in the direction A by the measurement subject moving unit 10, the distance of movement L is transmitted to the result display unit 40 (step S8). Here, although the movement distance L when moving the measurement subject 10 each time can be determined freely according to the sizes of the sensors 21 and the resolution at which the static electricity distribution needs to be measured, it is desirable for this to be the same length as the length of the side of each of the sensors in the same direction as the direction of movement A of the measurement subject 100 (from 0.1 mm to 5 mm). By employing this type of movement distance L, it is possible to measure the static electricity distribution more accurately and also more quickly.

Furthermore, the distance D between the lower surface of the measurement subject 100 and the upper surface of the detection unit 20 is measured by the reference distance measuring unit 35 (step S9). And the magnitudes of this distance D and the reference distance DS+α are compared together (step S10). If the distance D is greater than the reference distance DS+α, then the position of the vibrating unit 33 (i.e. its height h) is raised by just the predetermined height (step S11), and the distance D is measured again.

On the other hand, if the distance D is less than or equal to the reference distance DS+α, then the magnitudes of the distance D and the other reference distance DS α are compared together (step S12). And, if the distance D is less than the reference distance DS α, then the position of the vibrating unit 33 (i.e. its height h) is lowered by just the predetermined height (step S13).

Operation such as described above is repeated until the distance D is greater than DS α and is less than DS+α, and, when the distance D satisfies these conditions, the potential changes upon the portions of the measurement subject 100 that oppose the sensors 21 are detected, and this information (i.e. amount of change of potential, frequency, and phase angle) is transmitted to the electrostatic charge amount measuring unit 30 (step S14). And the operations in the steps S8 through S14 described above are repeated until the change of potential upon the entire surface of the measurement subject 100 is measured (step S15).

It should be understood that, if it is possible to consider the distance between the lower surface of the measurement subject 100 and the upper surface of the detection unit 20 as being constant, then the steps S9 through S13 may be omitted.

Subsequently, the result display unit 40 calculates information relating to the electrostatic charge amount distribution on the measurement subject 100 from the information about change of potential transmitted from the electrostatic charge amount measuring unit 30, the movement distance L of the measurement subject 100 each time, the number of times N the measurement subject 100 is moved, the amplitude R, and the reference distance DS (step S16). And the static electricity distribution on the measurement subject 100 is displayed upon the display unit 41.

In concrete terms, a data base consisting of a large amount of data related to potential changes, to reference distances, to amplitudes, and to the electrostatic charge amounts that correspond thereto is created and checked in advance and is stored, and the electrostatic charge amounts at this time are calculated from the amounts of change of potential received from the sensors 21, the reference distance DS, and the amplitude R. These electrostatic charge amounts are the amounts of electrostatic charge upon the portions of the measurement subject opposing those sensors 21 when the potential change is detected.

Accordingly, if the relative positions of the sensors 21 in the width direction of the measurement subject 100 are measured in advance, then it is possible to measure the distribution of static electricity upon the measurement subject 100 at high accuracy and at high speed according to the information related to potential changes received from the sensors 21 (i.e. the amounts, the frequencies, and the phase angles of the changes of potential), the movement distance L through which the measurement subject 100 is moved each time, the number of times that the measurement subject 100 is moved, the amplitude R, and the reference distance DS.

It should be understood that while, in the structure of this embodiment, the length of the array of sensors 21 is set to be somewhat longer than the dimension of the measurement subject 100 (i.e. the width of the measurement subject) in the direction orthogonal to its direction of movement A (i.e. its width direction), the length of the array of sensors 21 is not to be considered as being thereby limited. If the length of the array of sensors 21 is shorter than the width of the measurement subject, then it is not possible to measure the distribution of static electricity upon the measurement subject in a single episode of measurement, but it is possible to measure the distribution of static electricity upon the measurement subject by performing a plurality of measurement episodes.

Moreover although, in this embodiment, the absorption portions 25 are formed so as to surround the peripheries of the sensors 21, it is not necessary to form absorption portions so as to surround the sensors 21 perfectly; it would also be acceptable to arrange to form absorption portions around only parts of the peripheries of the sensors 21, for example along their right edges. As compared with the case in which the absorption portions are formed so as to surround the sensors 21 perfectly, their function for absorbing electromagnetic influences from portions other than the portions that oppose the sensors 21 is reduced, but it is still possible to measure electrostatic charge amounts.

And further although, in this embodiment, an object having a rectangular shape was employed as the measurement subject 100, the shape of the measurement subject 100 is not to be considered as being limited thereby. It would also be acceptable, for example, for the shape of the measurement subject 100 to be a circular cylindrical shape, or to be a shape of a film that is manufactured in a roll-to-roll format.

Furthermore although, in this embodiment, it is arranged to detect the changes of potential while repeatedly moving and stopping the measurement subject 100, the operation of the static electricity distribution measuring device 1 is not to be considered as being limited thereby. For example, it would also be acceptable to arrange, while moving the measurement subject 100 at a constant speed, to detect changes of potential each time a predetermined movement distance I is traversed. By operating in this manner, it is possible to measure the static electricity distribution upon the measurement subject more quickly.

It should be understood that, while in this case the speed at which the measurement subject 100 is moved is not to be considered as being particularly limited, it is desirable for this speed to be within the range of 0.1 mm/s to 200 mm/s, and in particular it is more desirable for it to be within the range of 1 to 20 mm/s. Furthermore, while the distance of movement 1 is also not to be considered as being particularly limited, it is desirable for this distance to be within the range of 0.01 mm to 5 mm, and in particular it is more desirable for it to be within the range of 0.1 mm to 1 mm.

Furthermore although, in this embodiment, the static electricity distribution device 1 is built so that the result display unit 40 also serves as a calculation unit, this is not to be considered as being limitative of the present invention. For example, it would also be acceptable to arrange to build the static electricity distribution device by employing a separate personal computer as the calculation unit, or the like.

A Concrete Example

A static electricity distribution measuring device was built having a detection unit employing sensors 21 made from copper foil and manufactured by patterning upon a printed circuit board, with those sensors being arranged in a single column (with 30 elements in that single column) at 1 mm intervals.

And, after having brought a metallic object into contact with a film of vinyl chloride of thickness 1 mm and dimensions 30 mm×60 mm so as to write the letters "AIST", the static electricity distribution upon this film was measured by employing the static electricity distribution measuring device under the conditions shown in FIG. 6. A graph of the results of this measurement is shown in FIG. 7.

It will be understood that, as shown in FIG. 7, this film was electrified in the configuration of the letters "AIST".

Embodiment #2

While, with the static electricity distribution measuring device according to the first embodiment, the detection unit 20 could only be moved upward and downward in parallel with itself, this should not be considered as being limitative of the present invention. For example, as shown in FIG. 8, it would also be acceptable to arrange to provide a pivoting unit 60 between a detection unit 20A and the shaft 32, so as to enable tilting (rotation) of the detection unit in the direction of movement of a measurement subject 100A (this direction of movement is perpendicular to the drawing paper). FIG. 8 is a schematic figure showing the detection unit 20A of this embodiment. By providing a pivoting unit 60 of this type, it is possible to tilt the detection unit 20A in accordance with the shape (i.e. the thickness) of the measurement subject 100A, so that the distances between the measurement subject 100A and the sensors 21 become equal. As a result it is possible to measure the static electricity distribution at high accuracy and moreover quickly, even in the case of a measurement subject 100A for which the shape (i.e. the inclination) of the surface changes.

It should be understood that the pivoting unit 60 is not to be considered as being particularly limited, provided that it is capable of tilting the detection unit 20A on the basis of the result of measurement by two reference distance measuring units 35A that are provided upon the upper surface of the detection unit 20A.

Furthermore, it would also be possible for a pivoting unit to be provided between the measurement subject and a measurement subject holding unit (i.e. at the end portion of the measurement subject holding unit toward the measurement subject); and these two pivoting units could be combined together. Since, by providing this structure, it would be possible to rotate the measurement subject, or the measurement subject and the detection unit, so that the distances between the measurement subject and the sensors become equal, accordingly the static electricity distribution measuring device of this embodiment provides similar advantageous effects.

Embodiment #3

While, with the static electricity distribution measuring devices according to Embodiments #1 and #2, the detection unit was built so that each of the sensors 21 became flush with its surface, this is not to be considered as being limitative of the present invention. For example, as shown in FIG. 9, it would also be acceptable to arrange to build a detection unit 20B so that each of the sensors 21 can be moved independently upward and downward. FIG. 9 is a schematic figure showing this detection unit 20B according to the third embodiment.

The detection unit 20B according to this embodiment may, for example, comprise a plurality of extension and retraction members 27 that are provided upon a base 28 made from resin or the like, with each of these extension and retraction members 27 being connected to one of the sensors 21 via an element 29 made from an insulating material such as resin or the like. Here, provided that they are capable of extension and retraction, the extension and retraction members 27 are not to be considered as being particularly limited; for example, actuators or the like may be suggested. A reference distance measuring unit (not shown in the figures) that measures the distance to the measurement subject is provided in the neighborhood of each of the sensors 21, and it is arranged for this distance to be controlled by the respective actuator according to the distance measured by this reference distance measuring unit, so as to be brought to be equal to the reference distance DS.

By building the detection unit 20B in this manner, and by adjusting the length of each of the sensors 21 to match the shape of the surface of the measurement subject, it is possible to perform adjustment so that, for each of the sensors 21, the distance to the surface of the measurement subject becomes the reference distance DS within ±a tolerance, even if the surface of the measurement subject has a complicated shape. As a result, even if the measurement subject has a complicated shape, it is still possible to perform measurement of the static electricity distribution thereupon at high accuracy and moreover quickly.

Other Embodiments

In the first embodiment the distance adjustment unit 34 was disposed below the vibrating unit 33, but the static electricity distribution measuring device according to the present invention is not to be considered as being limited by this feature. For example, it would also be acceptable to arrange to build the static electricity distribution measuring device so that the distance adjustment unit is disposed in the upper portion of the measurement subject holding unit 11, and to make it possible for the measurement subject holding unit 11 or the measurement subject moving unit 10 to be moved in the vertical direction, along with the measurement subject holding unit 11 being moved. Since, by providing this type of structure, it is possible to change the distance between the lower surface of the measurement subject and the upper surface of the detection unit whenever required, accordingly a similar advantageous effect can be obtained as in the case of the static electricity distribution measuring device of the first embodiment.

Moreover, in the first embodiment, it was arranged for the detection unit to be built with the sensors 21 being arrayed in the direction orthogonal to the direction of movement of the measurement subject 100, but the static electricity distribution measuring device according to the present invention is not to be considered as being limited by this feature. For example, it would also be acceptable to arrange for the sensors 21 to be arrayed, not in the direction orthogonal to the direction of movement of the measurement subject 100, but in some other direction. By providing a structure of this type, it would still be possible to provide similar advantageous effects to those provided by the static electricity distribution measuring device according to the first embodiment.

Moreover, in the first embodiment, the sensors 21 were provided as arranged in two columns upon the upper surface of the detection unit 20, but the static electricity distribution measuring device according to the present invention is not to be considered as being limited by this feature. For example it would be acceptable, upon the upper surface of the detection unit 20, to provide the sensors as arranged in a single column, or as arranged in three or more columns. Since the portion that is capable of detecting changes of potential becomes larger as the number of columns becomes greater, accordingly it is possible to measure the electrostatic charge amount distribution of the measurement subject more quickly.

Moreover, with the static electricity distribution measuring devices described above, it was arranged for the measurement subject to be moved, but the static electricity distribution measuring device according to the present invention is not to be considered as being limited by this feature. For example, it would also be acceptable to construct a static electricity distribution measuring device in which the measurement subject is fixed, and the static electricity distribution is measured while moving the detection unit; or it would also be acceptable to provide a construction in which both the measurement subject and the detection unit are capable of movement. With this type of structure as well, similar advantageous effects can be obtained as in the case of the static electricity distribution measuring devices described above.

Moreover, with the static electricity distribution measuring devices described above, it was arranged for the detection unit to be vibrated, but the static electricity distribution measuring device according to the present invention is not to be considered as being limited by this feature. For example, it would be acceptable to arrange for the detection unit to be fixed, and to cause the measurement subject to vibrate by disposing a vibrating unit between some fixed body and the measurement subject holding unit 11; or, alternatively, it would also be acceptable to construct the static electricity distribution measuring device so that both the detection unit and also the measurement subject can be caused to vibrate. With this type of structure as well, similar advantageous effects can be obtained as in the case of the static electricity distribution measuring devices described above.

Furthermore, it would also be acceptable to arrange for the static electricity distribution measuring device to be built with the static electricity distribution measuring device being disposed within a sealed space that is connected to a vacuum pump or the like and that is evacuated with the vacuum pump or the like, so that the measurement subject and the detection unit are disposed in an atmosphere of 100 atm or lower. Since, by providing this structure, it is possible to reduce the amount of gas (oxygen or the like) and/or of moisture, which can easily cause gas discharge, accordingly it is possible to measure the amount of electrostatic charge upon the surface of the measurement subject at higher accuracy.

It should be understood that, while in the first embodiment the static electricity distribution measuring device was built with the measurement subject moving unit being disposed in the upper portion thereof and with the detection unit being disposed in the lower portion thereof, the present invention is not to be considered as being limited by this feature. For example, it would also be acceptable to arrange to build the static electricity distribution measuring device so that the measurement subject moving unit is disposed in the lower portion thereof and the detection unit is disposed in the upper portion thereof. Since it is possible to hold the measurement subject from below by building the static electricity distribution measuring device in this manner, accordingly in this case it is also possible to measure an electrostatic charge amount distribution upon a powder or a fluid (i.e. a liquid) or the like.

REFERENCE SIGNS LIST

1: static electricity distribution measuring device
10: measurement subject moving unit
11: measurement subject holding unit
20, 20A, 20B: detection units
21: sensor
22: detection unit main body
23: electrically conductive member
24: connection portions
25: absorption portions
27: extension and retraction member
28: base
29: insulating material
30: electrostatic charge amount measuring unit
31: casing
32: shaft
33: vibrating unit
34: distance adjustment unit
35, 35A: reference distance measuring units
36: hole
40: result display unit
41: display unit
50: wiring
60: pivoting unit
100, 100A: measurement subjects

The invention claimed is:

1. A static electricity distribution measuring device, comprising:
a detection unit that moves continuously along a surface of an electrostatically charged subject to be measured in a predetermined relative direction, and provided on a surface of the detection unit with a plurality of sensors that detect potential changes generated by a distance to the surface of said measurement subject being changed;
a reference distance measuring unit that measures the distance between the surface of said measurement subject and the surface of said detection unit;
a distance adjustment unit that adjusts the distance between the surface of said measurement subject and the surface of said detection unit, so that the distance measured by the reference distance measuring unit becomes a reference distance that is determined in advance and is within a predetermined range;
a vibrating unit that causes the distance between the surface of said measurement subject and the surface of said detection unit to change upon a predetermined cycle;
an electrostatic charge amount measuring unit that measures at least one of change of potentials, frequencies, and phase angles of the potentials detected by said detection unit; and
a calculation unit that calculates an amount of electrostatic charge upon the surface of said measurement subject, on the basis of a distance that said measurement subject has moved with respect to said detection unit, and a result of measurement from said electrostatic charge amount measuring unit.

2. A static electricity distribution measuring device according to claim 1, wherein that said vibrating unit changes the distance between the surface of said measurement subject and the surface of said detection unit, according to the amount of electrostatic change upon the surface of said measurement subject as calculated by said calculation unit.

3. A static electricity distribution measuring device, comprising:
a detection unit that moves relatively along a surface of an electrostatically charged subject to be measured, and provided on a surface of the detection unit with a plurality of sensors that detect potential changes generated by the distance to the surface of said measurement subject being changed;
a reference distance measuring unit that measures the distance between the surface of said measurement subject and the surface of said detection unit;
a distance adjustment unit that adjusts the distance between the surface of said measurement subject and the surface of said detection unit, so that the distance measured by the reference distance measuring unit becomes a reference distance that is determined in advance and is within a predetermined range;
a vibrating unit that causes the distance between the surface of said measurement subject and the surface of said detection unit to change upon a predetermined cycle;
an electrostatic charge amount measuring unit that measures at least one of an amount of change of potentials, frequencies, and phase angles of the potentials detected by said detection unit; and
a calculation unit that calculates an amount of electrostatic charge on the surface of said measurement subject, on the basis of a distance that said measurement subject has moved with respect to said detection unit, and a result of measurement from said electrostatic charge amount measuring unit,
wherein said vibrating unit changes the distance between the surface of said measurement subject and the surface of said detection unit, according to the amount of electrostatic charge upon the surface of said measurement subject as calculated by said calculation unit.

4. A static electricity distribution measuring device according to claim 1, wherein said detection unit that is connected to said vibrating unit is disposed above said measurement subject.

5. A static electricity distribution measuring device according to claim 1, wherein said plurality of sensors are arranged in a column in a direction that intersects the direction of movement of said measurement subject.

6. A static electricity distribution measuring device according to claim 1, wherein a pivoting unit is provided that is capable of pivoting at least either one of said measurement subject and said detection unit; so that said detection unit becomes parallel to the surface of said measurement subject.

7. A static electricity distribution measuring device according to claim 1, wherein each of said sensors is capable of movement in the direction of said measurement subject.

8. A static electricity distribution measuring device according to claim 1, wherein absorption portions that absorb electromagnetic influence are provided upon at least portions of the peripheries of the sensors.

9. A static electricity distribution measuring device according to claim 1, wherein said measurement subject and said detection unit are held within an atmosphere of 100 atm or lower.

10. A static electricity distribution measuring device according to claim 3, wherein said detection unit that is connected to said vibrating unit is disposed above said measurement subject.

11. A static electricity distribution measuring device according to claim 3, wherein said plurality of sensors are arranged in a column in a direction that intersects the direction of movement of said measurement subject.

12. A static electricity distribution measuring device according to claim 3, wherein a pivoting unit is provided that is capable of pivoting at least either one of said measurement subject and said detection unit, so that said detection unit becomes parallel to the surface of said measurement subject.

13. A static electricity distribution measuring device according to claim 3, wherein each of said sensors is capable of movement in the direction of said measurement subject.

14. A static electricity distribution measuring device according to claim 3, wherein absorption portions that absorb electromagnetic influence are provided upon at least portions of the peripheries of the sensors.

15. A static electricity distribution measuring device according to claim 3, wherein said measurement subject and said detection unit are held within an atmosphere of 100 atm or lower.

* * * * *